United States Patent
Lasch et al.

(10) Patent No.: US 8,756,408 B2
(45) Date of Patent: Jun. 17, 2014

(54) HARDWARE RESET REASON

(75) Inventors: Jonathan Lasch, Northbrook, IL (US); Dale Fiepke, Wauconda, IL (US)

(73) Assignee: Continental Automotive Systems, Inc, Auburn Hills, MI (US)

( * ) Notice: Subject to any disclaimer, the term of this patent is extended or adjusted under 35 U.S.C. 154(b) by 493 days.

(21) Appl. No.: 13/027,763

(22) Filed: Feb. 15, 2011

(65) Prior Publication Data

US 2012/0210109 A1   Aug. 16, 2012

(51) Int. Cl.
| | | |
|---|---|---|
| G06F 1/24 | (2006.01) | |
| G06F 11/00 | (2006.01) | |
| G06F 11/07 | (2006.01) | |
| G01R 29/027 | (2006.01) | |

(52) U.S. Cl.
CPC ............... *G06F 11/079* (2013.01); *G06F 1/24* (2013.01); *G01R 29/0273* (2013.01)
USPC ......... 713/1; 713/2; 713/100; 714/23; 714/25

(58) Field of Classification Search
CPC .... G01R 29/027; G01R 29/023; G01R 29/02; G01R 29/0273; G01F 1/24; G01F 15/177; G06F 9/445; G06F 11/00; G06F 11/22; G06F 11/2236; G06F 11/079
USPC ............................... 714/23, 25; 713/1, 2, 100
See application file for complete search history.

(56) References Cited

U.S. PATENT DOCUMENTS

| | | | |
|---|---|---|---|
| 5,960,195 A | 9/1999 | Kang et al. | |
| 8,046,596 B2 * | 10/2011 | Ciaffi et al. | 713/300 |
| 8,171,352 B2 * | 5/2012 | Stachler | 714/55 |
| 8,291,205 B2 * | 10/2012 | Suryawanshi | 713/1 |
| 2003/0065916 A1 | 4/2003 | Erickson et al. | |
| 2011/0002147 A1 * | 1/2011 | Fukui | 363/21.12 |

FOREIGN PATENT DOCUMENTS

GB      2243468 A1   10/1991

OTHER PUBLICATIONS

International Search Report and Written Opinion dated Oct. 9, 2012, from corresponding International Patent Application No. PCT/US2012/023144.

* cited by examiner

*Primary Examiner* — Fahmida Rahman

(57) ABSTRACT

Some microprocessors and microcontrollers have a bi-directional reset pin. In such devices, output signals on the reset pin are decoded by reset reason decode logic circuitry. The output of the reset reason decode logic can be provided to another device or processor, which generates a readily recognizable output signal indicative of a reason why the processor reset. Output signals that can indicate why a processor was reset can include a high or low state of different durations, serial bit streams or a number of pulses, each of which correspond to and therefore identify a reason why the processor was reset.

11 Claims, 3 Drawing Sheets

HARDWARE RESET REASON

BACKGROUND

Most microprocessors and microcontrollers have bi-directional external reset pins. Bi-directional reset pins act as both an input and an output. When used as an input, driving (forcing) the reset pin to a logic one or logic zero forces the processor to restart or reset. When used as an output, the signal or state of the reset pin provides an indication as to why an event or condition occurred which caused the processor to reset itself.

A processor can reset itself for a variety of reasons. Such reasons include but are not limited to the expiration of a hardware "watchdog timer," a clock pulse frequency monitor, a voltage range monitor and a memory protection unit. Signals that are output on a processor reset pin can thus be evaluated with specialized equipment, i.e., "debug" tools, to determine why a processor reset. Unfortunately, tools that are capable of reading signals on reset pin are costly and cumbersome to operate. A cost efficient and real time evaluation of a reset pin output signal is thus problematic. An apparatus for, and a method of evaluating signals on a reset pin would be an improvement over the prior art.

DETAILED DESCRIPTION

Figure 1:
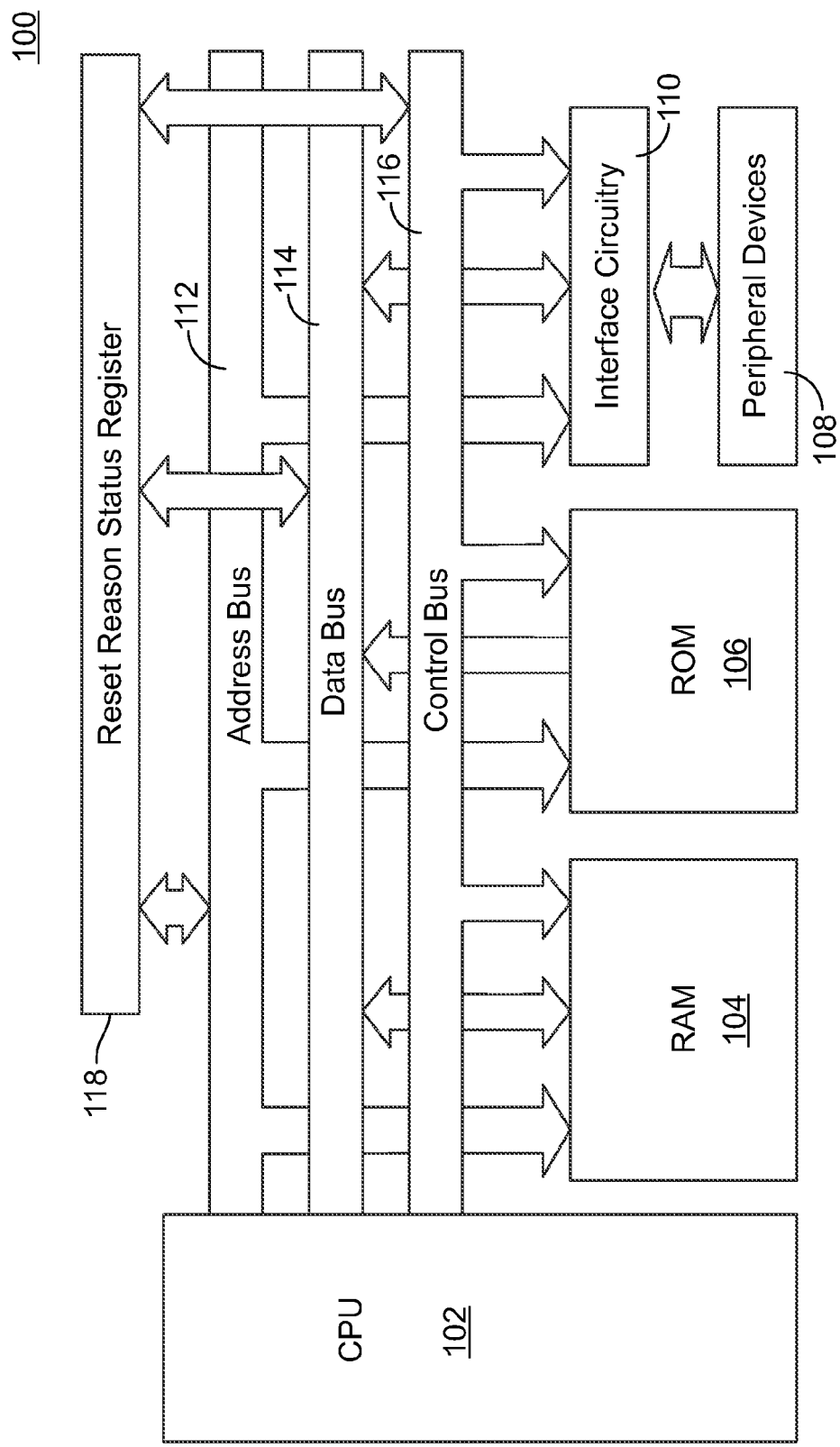
FIG. 1 is a block diagram of a prior art microprocessor or microcontroller.

FIG. 1 is a block diagram of a prior art microprocessor or microcontroller 100, both of which are collectively referred hereinafter simply as a processor. The processor 100 is comprised of a CPU or central processing unit 102, which is the computational and control unit of the processor 100. The CPU 102 reads instructions and data in memory devices that are coupled to the CPU 102 via busses 112, 114 and 116, which are described more fully below. It then interprets and executes instructions and performs mathematical operations using one or more accumulator registers, not shown but well known to those of ordinary skill in the computer art.

Executable instructions for the CPU 102 are stored in a random access memory or RAM 104. Executable program instructions are also be stored in read only memory or ROM 106. Executable instructions can also be stored in both the RAM 104 and the ROM 106. In one embodiment, the RAM 104 and ROM 106 are resident on the same semiconductor die as the CPU 102. In alternate embodiments, however, the RAM and ROM that store program instructions can be physically separate devices that are coupled to the CPU 102 via busses.

The processor 100 controls and responds to external devices, examples of which are too numerous to list or describe but are collectively referred to simply as peripheral devices 108. Communications between the CPU 102 and peripheral devices 108 takes place through interface circuitry 110. The interface circuitry 110, the RAM 104 and ROM 106 are coupled to the CPU 102 through an address bus 112, a data bus 114, and a control bus 116.

A "bus" is considered herein to be a conductor or group of conductors that serve or provide common connections between circuits that include the CPU 102, memory devices, interface circuitry and other addressable circuits. A bus is also considered to be a controlled network technology by which circuits connected to the bus are able to read signals on the bus and respond thereto. In FIG. 1, the address bus 112 carries binary-valued signals that identify locations or addresses of memory locations. The data bus 114 carries non-address information to and from an accumulator in the CPU 102. The control bus 116 carries signals that determine, among other things, memory read and write cycles and access to input/output devices. The busses 112, 114 and 116 couple the CPU 102, the RAM 104, the ROM 106 and the interface circuitry 110 together.

The interface circuitry 110 is attached to the busses and includes, but is not limited to, parallel-to-serial and serial-to-parallel data converters. Such devices are well known in the art. The interface circuitry 110 also includes analog-to-digital (A/D) and digital-to-analog (D/A) converters, which are also well known in the art.

The RAM 104 can be either static RAM or dynamic RAM both of which are well known in the art. The ROM 106 can be a so-called "mask" ROM but can also be EPROM or EEPROM or flash memory.

A reset reason status register 118 is attached to all three busses 112, 114 and 116. It is a multi-bit register that is loaded by either the CPU 102 or other device on the busses that cause the processor 100 to reset. The register 118 is loaded with a binary value or pattern of binary digits that identifies the device or event that caused the processor to reset.

Figure 2:
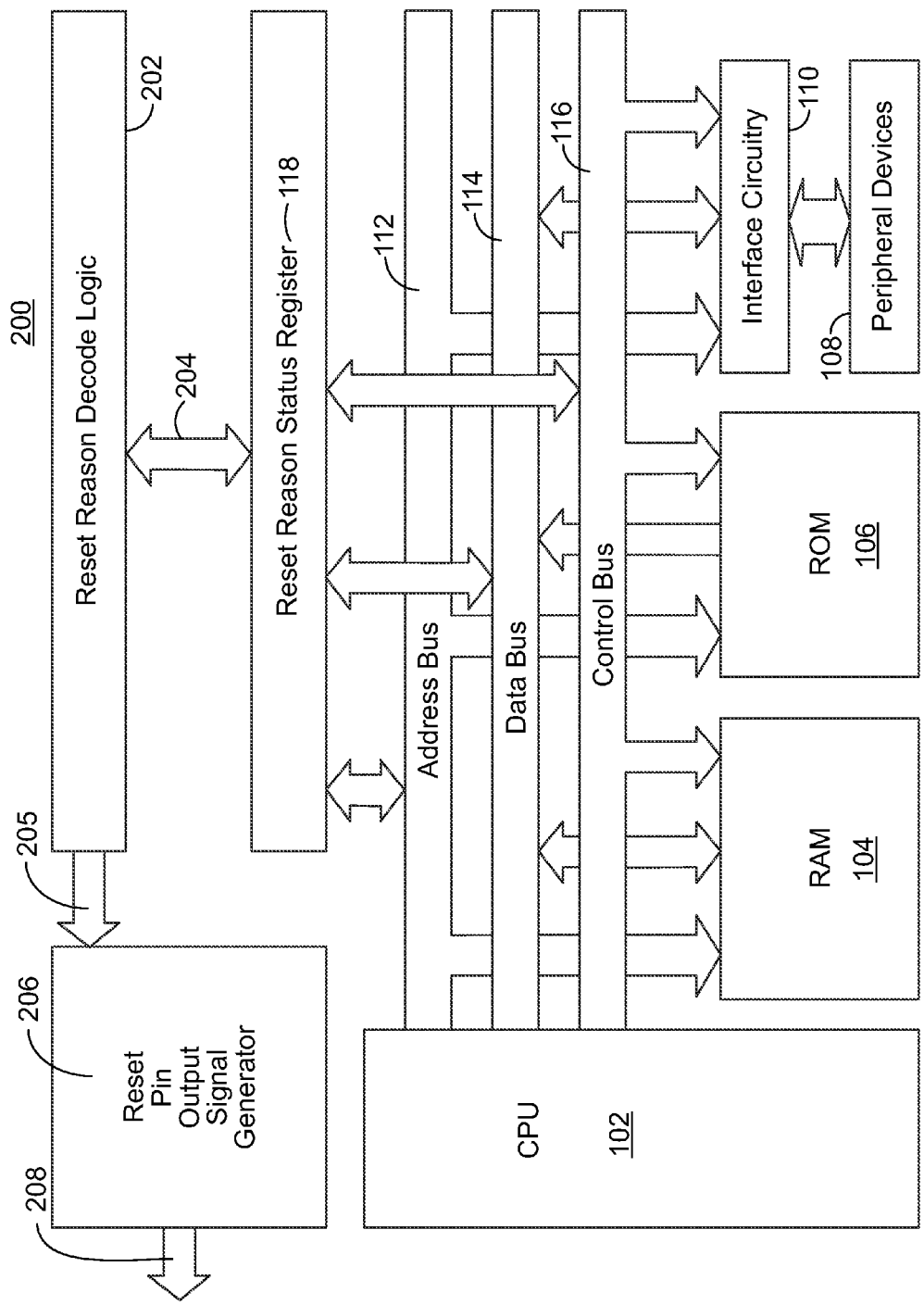
FIG. 2 is a block diagram of a microprocessor or microcontroller having reset reason decode logic and a reset pin output signal generator.

FIG. 2 is a block diagram of a processor 200 provided with a reset reason status register 118, reset reason decoding logic 202 and a reset pin output signal generator 206. Together, the reset reason decode logic 202 and the reset pin output signal generator 206 comprise a reset decoding device for the processor 200 and which provides an output signal on a reset pin which can be directly decoded or read to determine why the processor reset itself internally. Stated another way, the reset reason decode logic 202 evaluates the binary-valued signal from the reset reason status register 118 and from the contents of that register, identifies the event that caused the processor to be reset. The reset pin output signal generator 206 provides on a reset pin 208, a signal that identifies an event that caused the processor to be reset.

As stated above, the reset status register 118 is preferably a multi-bit, i.e., having more than one binary digit, data latch operatively coupled to the address bus 112, the data bus 114, and the control bus 116. It is therefore responsive to signals placed on those buses by the CPU 102 as it executes instructions. The reset status register 118 is therefore responsive to program instructions executed by the CPU 102.

The contents of the reset reason status register 118 are loaded by one or both the CPU 102 or the mechanism that caused the reset with one or more patterns of binary digits, the particular values or patterns of which correspond to a reason why the processor 200 was reset internally. Stated another way, some processor embodiments have a CPU 102 that can load the reset reason status register 118. Other processor embodiments are configured with a reset reason status register 118 that is loaded by a device other than the CPU 102. Still other processor embodiments are configured to have the reset reason status register loaded by either the CPU 102 or other mechanisms.

The output of the reset reason status register 118 is provided to a reset reason decode logic circuit 202 via a reset reason bus 204. The reset reason decode logic 204 is comprised of combinational logic gates that decode the contents of the reason status register 118 and provide one or more output signals on a reset output bus 205 that correspond to, i.e., they identify, a reason why the processor 200 was reset internally.

The reset output bus 205 can be comprised of a single pin or a multi-pin bus. The signals on the reset output bus 205 correspond to, i.e., identify, a reason why the processor 200 was reset. Examples of signals on the reset output bus 205 include but are not limited to a number of clock cycles, or fixed-durations during which the signal level on the pin 205 is held a logic one or a logic zero. Properly evaluation of the signals on the reset output bus 205 provides a reason why the processor 200 reset itself.

By way of example, the reset output bus 205 can be held low for say, 100 clock cycles, or perhaps 100 milliseconds, if the processor 200 resets itself because the power supply voltage was determined to be too low. An illegal address fetch on the address bus 112 might cause the processor 100 to reset itself and as a result, the hardware reset pin 205 can be held "low" for 200 clock cycles or perhaps 200 milliseconds.

A binary-valued signal on the hardware reset pin 205 can also be comprised of a serial bit stream, the time or synchronization of which is based off the processor's clock signal. By way of example, a low voltage reset reason might be represented on the hardware reset pin 205 by a series of four logic zeros followed by a series of four logic ones, to with 00001111. An illegal address fetch on the address bus 112 might be comprised of eight binary-valued zeros or eight binary-valued ones, to with 11111111 or 00000000. In yet another embodiment, reset reason decode logic circuitry 204 provides a parallel set of output pins, the parallel contents of which correspond to a reset reason.

In one preferred embodiment, the hardware reset pin 205 is coupled to a processor denominated as a reset pin output function generator 206. The reset pin output function generator 206 acquires or "reads" the signals on the hardware reset pin 205 (or reset pins 205) and provides one or more of the aforementioned output signals onto an externally available bi-directional reset pin 208. In another preferred embodiment, the reset pin output signal generator 206 sends a reset signal to the CPU 102, which causes the CPU 102 to reconfigure itself after the reset even occurred.

Figure 3:
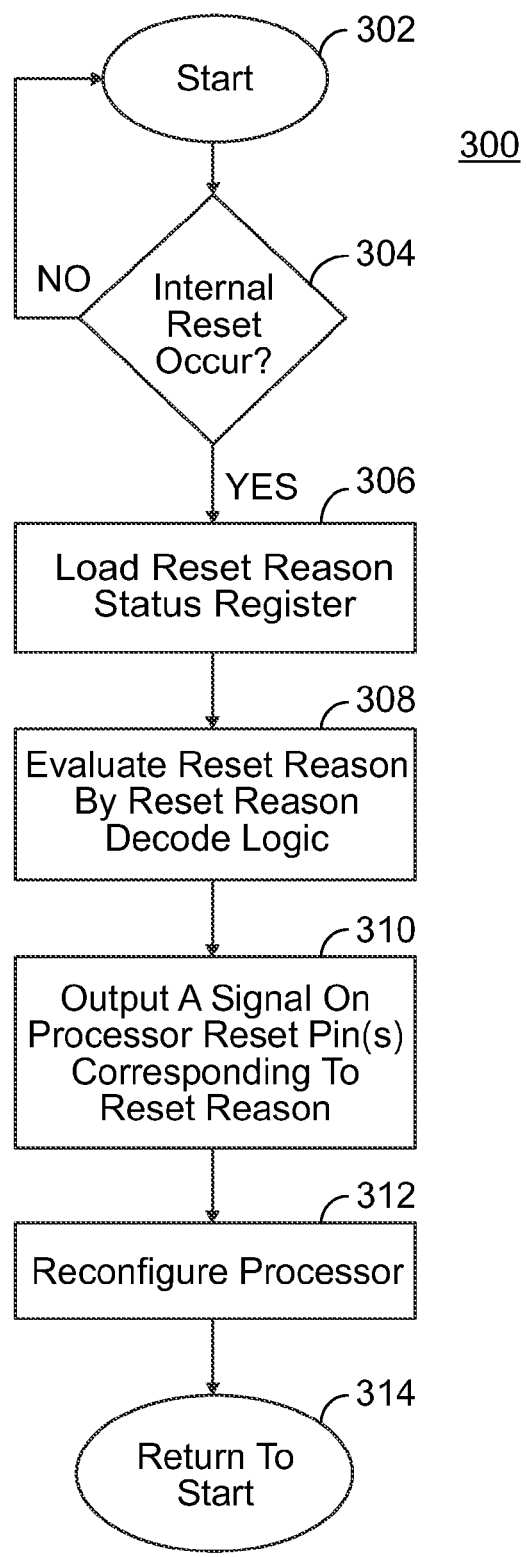
FIG. 3 is a block diagram of a method for communicating to the exterior of a processor having a reset reason register, a reason for the processor being reset.

FIG. 3 is a block diagram of a method of communicating to the exterior of the processor 200, a reason for the processor 200 being reset. The method 300 begins at step 302, proceeds to step 304 and waits at step 304 until a processor internal reset event occurs. After an internal reset event occurs, such as an attempt to write data into ROM 106, the method 300 proceeds to step 306 whereat the CPU 102 loads the reset reason status register 118 with a binary pattern or binary-valued signal, which corresponds to the reason for the processor 200 being reset.

Once the reset reason status register 118 is loaded with a binary-valued signal or bit pattern, the contents of the reset reason status register 118 are asynchronously evaluated by the reset reason decode logic 202. Step 308 thus indicates that the next step of the method is to evaluate the reset reason status register 118. Once a reset reason has been evaluated by the decode logic 204, the next step of the method is to generate or output a signal on the processor reset pin 208 which is indicative of a particular reason why the processor 200 was reset.

As stated above, outputting a signal on the reset pin includes outputting one or more binary-valued signals. Such signals can be either parallel binary digits or a serial binary stream. The output signal can also be embodied as a time-dependent duration signal on a single processor pin or a series of pulses. In yet another embodiment, multiple different output reset pins can be provided to the processor 200.

The reset pin output signal generator 206 is preferably resident on the same die as the other functional elements of the processor 200. In another embodiment however the reset pin output signal generator 206 can be resident on a separate integrated die or substrate and coupled to a reset reason decode logic circuit 202 through externally available pins on the package on which the processor 200 is resident.

The foregoing is for purposes of illustration only. The true scope of the invention is set forth by the appurtenant claims.

What is claimed is:

1. A processor comprising:
    a plurality of busses, each bus comprising a corresponding plurality of conductors, each bus providing corresponding connections between the processor and addressable circuits;
    a reset decoding device comprising combinational logic circuits coupled to the conductors of each bus, the combinational logic circuits being configured to:
        evaluate binary-valued signals on the plurality of busses, which identify an event that caused the processor to reset itself; and
        output a signal on a first processor pin, the signal output on the first processor pin identifying the event causing the processor to reset itself, wherein the signal on the first processor pin comprises a binary valued signal capable of having a plurality of different time durations, the time duration of the binary-valued signal corresponding to an event that caused the processor to reset itself.

2. The processor of claim 1, further comprising a reset reason register operatively coupled between the plurality of busses and the reset decoding device, the reset reason register storing the binary-valued signals obtained from the busses, responsive to instructions executed by the processor.

3. The processor of claim 2, wherein the reset reason register and the register decoding device are co-located on the same silicon die.

4. The processor of claim 1, wherein the signal on the first processor pin comprises a plurality of binary-valued signals.

5. The processor of claim 4, wherein the plurality of binary-valued signals are output serially on the first processor pin.

6. A processor comprising:
    a plurality of busses, each bus comprising a corresponding plurality of conductors, each bus providing corresponding connections between the processor and addressable circuits;
    a reset decoding device comprising combinational logic circuits coupled to the conductors of each bus, the combinational logic circuits being configured to:
        evaluate binary-valued signals on the plurality of busses, which identify an event that caused the processor to reset itself, and
        output a signal on a first processor pin, the signal output on the first processor pin identifying the event causing the processor to reset itself; and
    a monitoring processor operatively coupled to the combinational logic gates, the monitoring processor being configured to evaluate the signal output on the first processor pin and provide a second signal on an externally-available, bi-directional reset pin, the second signal on the externally-available, bi-directional reset pin identifying a reason why the processor reset itself.

7. The processor of claim 6, wherein the monitoring processor is further additionally configured to reconfigure the processor and specify a series of instructions to be executed by the processor after the reset signal is received by the monitoring processor.

8. A method of communicating to the exterior of a processor having a plurality of busses and a reset reason register coupled to the busses, a reason for the processor to reset itself, the method comprising the steps of:
- loading the reset reason register with a binary pattern obtained from the plurality of busses, the binary pattern corresponding to a reason for the processor to reset itself; and
- evaluating the binary pattern in the reset reason register with combinational logic circuits configured to evaluate the contents of the reset reason register and output a signal on a processor pin, the signal output on the processor pin identifying an event causing the processor to reset itself, wherein the signal on the processor pin comprises a binary valued signal capable of having a plurality of different time durations, the time duration of the binary-valued signal corresponding to an event that caused the processor to reset itself.

9. The method of claim 8, wherein the signal on the processor pin is comprised of a plurality of binary-valued signals.

10. The method of claim 9, wherein the plurality of binary-valued signals are output serially on the processor pin.

11. A method of communicating to the exterior of a processor having a plurality of busses and a reset reason register coupled to the busses, a reason for the processor to reset itself, the method comprising the steps of:
- loading the reset reason register with a binary pattern obtained from the plurality of busses, the binary pattern corresponding to a reason for the processor to reset itself; and
- evaluating the binary pattern in the reset reason register with combinational logic circuits configured to evaluate the contents of the reset reason register and output a signal on a processor pin, the signal output on the processor pin identifying an event causing the processor to reset itself;
- wherein the processor is a main processor and wherein the combinational logic circuits coupled to a second, monitoring processor, which provides an externally-available bi-directional reset pin for the main processor, the monitoring processor being configured to execute program instructions, which when executed cause the monitoring processor to evaluate the contents of the reset reason register, the method further comprising the step of providing an output signal on the externally-available bi-directional reset pin, which indicates a reason why the main processor reset itself.

* * * * *